United States Patent
Ohki et al.

(10) Patent No.: US 9,564,527 B2
(45) Date of Patent: Feb. 7, 2017

(54) SEMICONDUCTOR DEVICE AND MANUFACTURING METHOD OF SEMICONDUCTOR DEVICE

(71) Applicant: FUJITSU LIMITED, Kawasaki-shi (JP)

(72) Inventors: Toshihiro Ohki, Hadano (JP); Masato Nishimori, Atsugi (JP); Tadahiro Imada, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 13/869,271

(22) Filed: Apr. 24, 2013

(65) Prior Publication Data
US 2013/0228795 A1      Sep. 5, 2013

Related U.S. Application Data

(63) Continuation of application No. PCT/JP2010/069733, filed on Nov. 5, 2010.

(51) Int. Cl.
*H01L 29/78*      (2006.01)
*H01L 29/66*      (2006.01)
(Continued)

(52) U.S. Cl.
CPC ....... *H01L 29/7827* (2013.01); *H01L 29/0653* (2013.01); *H01L 29/0886* (2013.01);
(Continued)

(58) Field of Classification Search
CPC ............. H01L 29/7827; H01L 29/0653; H01L 29/0886; H01L 29/2003; H01L 29/402; H01L 29/407; H01L 29/41741; H01L 29/66666; H01L 29/66734; H01L 29/7813
(Continued)

(56) References Cited

U.S. PATENT DOCUMENTS 4,374,455 A * 2/1983 Goodman ............... 438/271
4,839,310 A * 6/1989 Hollis .................. C23C 14/225
257/194

(Continued)

FOREIGN PATENT DOCUMENTS

JP      04-233764      8/1992
JP      08-321611      12/1996
(Continued)

OTHER PUBLICATIONS

Hirotaka Otake, et al.; "Vertical GaN-Based Trench Gate Metal Oxide Semiconductor Field-Effect Transistors on GaN Bulk Substrates", Applied Physics Express 1 (2008) 011105. Research and Development Headquarters, *ROHM Co., Ltd., Kyoto 615-8585, Japan*. Received Nov. 5, 2007; accepted Nov. 12, 2007; published online Jan. 11, 2008, pp. 011105-1-011105-3.

(Continued)

*Primary Examiner* — Jarrett Stark
*Assistant Examiner* — Charles N Ausar-El
(74) *Attorney, Agent, or Firm* — Fujitsu Patent Center

(57) ABSTRACT

A semiconductor device includes a first semiconductor layer of a first conductivity type formed on one side of a semiconductor substrate; a second semiconductor layer of a second conductivity type formed on the first semiconductor layer; a third semiconductor layer of the first conductivity type formed on the second semiconductor layer; an opening part formed by removing part of the first to third semiconductor layers; a gate insulating film formed so as to cover an inner wall of the opening part; a gate electrode formed inside the opening part via the gate insulating film; a source electrode formed on a surface of the third semiconductor layer; a drain electrode connected to a part corresponding to the gate electrode on another side of the semiconductor substrate; and a fourth electrode formed on the another side (Continued)

of the semiconductor substrate at a part corresponding to the source electrode.

8 Claims, 16 Drawing Sheets

(51) Int. Cl.
    *H01L 29/24*     (2006.01)
    *H01L 29/40*     (2006.01)
    *H01L 29/417*    (2006.01)
    *H01L 29/423*    (2006.01)
    *H01L 29/06*     (2006.01)
    *H01L 29/08*     (2006.01)
    *H01L 29/20*     (2006.01)
    *H01L 29/267*    (2006.01)

(52) U.S. Cl.
    CPC ........ *H01L 29/2003* (2013.01); *H01L 29/402* (2013.01); *H01L 29/407* (2013.01); *H01L 29/41741* (2013.01); *H01L 29/66666* (2013.01); *H01L 29/66734* (2013.01); *H01L 29/7813* (2013.01); *H01L 29/7831* (2013.01); *H01L 29/0657* (2013.01); *H01L 29/267* (2013.01)

(58) Field of Classification Search
    USPC .......................................................... 257/76
    See application file for complete search history.

(56) References Cited

U.S. PATENT DOCUMENTS

| | | | |
|---|---|---|---|
| 5,294,559 A | | 3/1994 | Malhi |
| 5,894,149 A | * | 4/1999 | Uenishi ............... H01L 29/0653 257/129 |
| 6,194,773 B1 | | 2/2001 | Malhi |
| 7,320,908 B2 | * | 1/2008 | Son ................... H01L 21/82348 257/E21.429 |
| 2007/0023830 A1 | * | 2/2007 | Pfirsch ................ H01L 29/0634 257/341 |
| 2007/0111456 A1 | | 5/2007 | Ji et al. |
| 2009/0218621 A1 | * | 9/2009 | Pfirsch ................ H01L 29/0634 257/342 |
| 2009/0278197 A1 | | 11/2009 | Ohta et al. |
| 2009/0315037 A1 | * | 12/2009 | Kikkawa ......................... 257/76 |
| 2009/0321854 A1 | * | 12/2009 | Ohta ............................. 257/411 |
| 2010/0096664 A1 | * | 4/2010 | Tsukuda ........................ 257/139 |
| 2012/0208331 A1 | * | 8/2012 | Kikkawa ....................... 438/172 |

FOREIGN PATENT DOCUMENTS

| | | | |
|---|---|---|---|
| JP | 11-354786 | * | 12/1999 |
| JP | 2002-359256 | | 12/2002 |
| JP | 2004-022644 | * | 1/2004 |
| JP | 2008-053448 | | 3/2008 |
| JP | 2010-098189 | | 4/2010 |

OTHER PUBLICATIONS

Masahito Kodama, et al.; "GaN-Based Trench Gate Metal Oxide Semiconductor Field-Effect Transistor Fabricated with Novel Wet Etching", Applied Physics Express 1 (2008) 021104. Toyota Central R&D Laboratories, Inc., *Nagakute-cho, Aichi 480-1192, Japan,* Toyota Motor Corp., 543 Kirigahora, Nishihirose-cho, Toyota, *Aichi 470-0309, Japan,* Received Dec. 21, 2007; accepted Jan. 24, 2008; published online Feb. 15, 2008, pp. 021104-1-021104-3.

International Search Report, mailed in connection with PCT/JP2010/069733 and mailed Feb. 8, 2011.

CNOA—Office Action mailed on Mar. 12, 2015 issued with respect to the corresponding Chinese Patent Application No. 201080069927.0.

CNOA—The Second Office Action dated Sep. 30, 2015 issued with respect to the corresponding Chinese Patent Application No. 201080069927.0.

\* cited by examiner

SEMICONDUCTOR DEVICE AND MANUFACTURING METHOD OF SEMICONDUCTOR DEVICE

CROSS-REFERENCE TO RELATED APPLICATION

This patent application is based upon and claims the benefit of priority under 35 USC 120 and 365(c) of PCT application JP2010/069733 filed in Japan on Nov. 5, 2010, the entire contents of which are incorporated herein by reference.

FIELD

The embodiments discussed herein are related to a semiconductor device and a manufacturing method of a semiconductor device.

BACKGROUND

Nitride semiconductors such as GaN, AlN, and InN have a wide band gap and good material properties, and may therefore be used for high breakdown voltage electronic devices or short-wavelength light emitting devices. Particularly, as to field effect transistors (FET) to be used as high breakdown voltage electronic devices, studies are being made in regard to High Electron Mobility Transistors (HEMT), which may be used for high output/high efficiency amplifiers and high power switching devices.

Incidentally, in a conventional HEMT having a horizontal structure (a structure in which the current flows substantially parallel to the substrate surface), when a sufficient amount of breakdown voltage is to be secured for use in high power/high breakdown voltage switching devices, a long inter-electrode length is to be formed. In this case, the chip size of the device to be formed is increased, and the number of chips that may be manufactured from one wafer is decreased, which leads to an increase in the manufacturing cost, resulting in high cost.

Therefore, in high power/high breakdown voltage switching devices, a field effect transistor having a vertical structure (a structure in which the current flows substantially perpendicular to the substrate surface) is garnering attention, because the chip size may be decreased with such a structure.

Patent document 1: Japanese Laid-Open Patent Publication No. 2002-359256
Patent document 2: Japanese Laid-Open Patent Publication No. 2008-53448
Non-patent document 1: Applied Physics Express 1 (2008) 011105
Non-patent document 2: Applied Physics Express 1 (2008) 021104

For example, a field effect transistor having a vertical structure has a source electrode formed on one side of a substrate and a drain electrode formed on the other side of the substrate. Specifically, a description is given of a field effect transistor having a vertical structure, with reference to FIG. 1.

In the field effect transistor having a vertical structure, on a substrate 611 constituted by $n^+$-SiC or $n^+$-GaN, a n-GaN layer 612, a p-GaN layer 613, and a n-GaN layer 614 are formed. On part of the surface of the n-GaN layer 614, a source electrode 621 is formed. Furthermore, an opening part is formed by etching part of the n-GaN layer 614, the p-GaN layer 613, and the GaN layer 612 from the surface of the n-GaN layer 614. An insulating film 615 is formed so as to cover the surface of the n-GaN layer 614 and the surface of the inside of the opening part. Furthermore, in the opening part, a gate electrode 622 is formed via the insulating film 615. On the back side of the substrate 611, i.e., on the side opposite to the side on which the semiconductor layer is formed, a drain electrode 623 is formed.

In a field effect transistor having the above structure, when a voltage is applied between the source electrode 621 and the drain electrode 623, regardless of the potential of the gate electrode 622, a leakage current passing the p-GaN layer 613 is generated. That is to say, in an area other than the area that is the current path indicated by a dashed-line arrow A, a leakage current flowing through the p-GaN layer 613 indicated by a dashed-line arrow B is generated. When such a leakage current is generated, properties of the field effect transistor are degraded.

Thus, there is demand for a semiconductor device and a manufacturing method of a semiconductor device having a high insulation breakdown voltage, a small chip size, and a small amount of leakage current.

SUMMARY

According to an aspect of the embodiments, a semiconductor device includes a first semiconductor layer of a first conductivity type formed on one side of a semiconductor substrate having conductivity; a second semiconductor layer of a second conductivity type formed on the first semiconductor layer; a third semiconductor layer of the first conductivity type formed on the second semiconductor layer; an opening part formed by removing part of the third semiconductor layer, the second semiconductor layer, and the first semiconductor layer; a gate insulating film formed so as to cover an inner wall of the opening part; a gate electrode formed inside the opening part via the gate insulating film; a source electrode formed on a surface of the third semiconductor layer; a drain electrode connected to a part corresponding to the gate electrode on another side of the semiconductor substrate; and a fourth electrode formed on the another side of the semiconductor substrate at a part corresponding to the source electrode.

The object and advantages of the invention will be realized and attained by means of the elements and combinations particularly pointed out in the appended claims. It is to be understood that both the foregoing general description and the following detailed description are exemplary and explanatory and are not restrictive of the invention as claimed.

DESCRIPTION OF EMBODIMENTS

Figure 1:
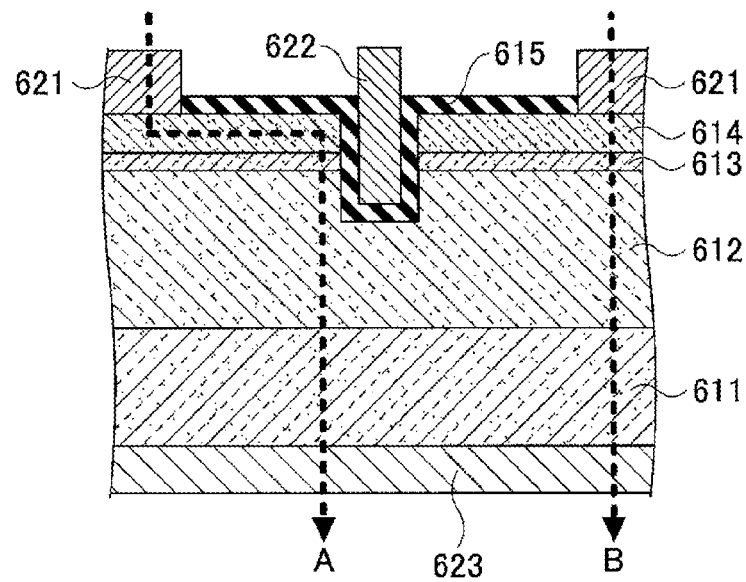
FIG. 1 is a structural diagram of a field effect transistor having a vertical structure.

Embodiments of the present invention will be explained with reference to accompanying drawings. The same elements are denoted by the same reference numerals and overlapping descriptions are omitted.

First Embodiment

Semiconductor Device

Figure 2:
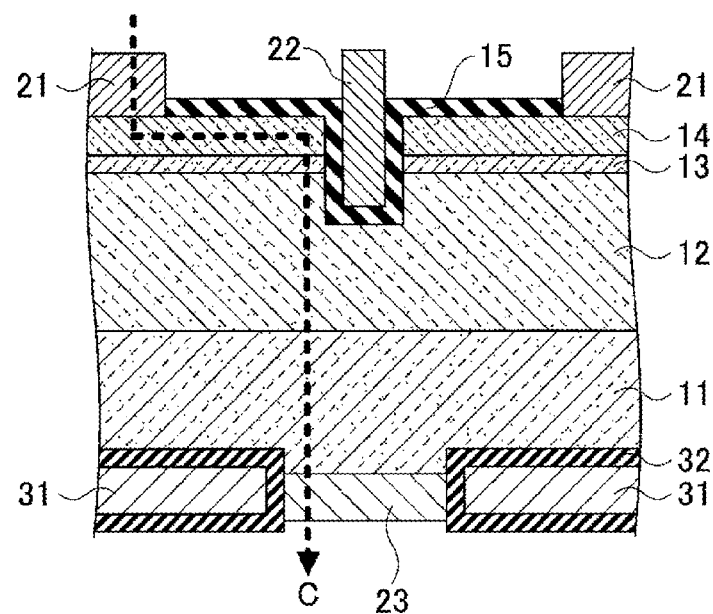
FIG. 2 is a structural diagram of a semiconductor device according to a first embodiment.

A description is given of a semiconductor device according to the present embodiment. As illustrated in FIG. 2, a semiconductor device according to the present embodiment is a field effect transistor having a vertical structure. Specifically, on a substrate 11 constituted by $n^+$-SiC or $n^+$-GaN, a n-GaN layer 12, a p-GaN layer 13, and a n-GaN layer 14 are formed. On part of the surface of the n-GaN layer 14, a source electrode 21 is formed. Furthermore, an opening part is formed by etching part of the p-GaN layer 13 and the n-GaN layer 12 from the surface of the n-GaN layer 14. A gate insulating film 15 is formed so as to cover the surface of the n-GaN layer 14 and the surface of the inside of the opening part. In the opening part, a gate electrode 22 is formed via the gate insulating film 15.

On the back side of the substrate 11, i.e., on the side opposite to the side on which the semiconductor layer is formed, a drain electrode 23 is formed in a part corresponding to the area where the gate electrode 22 is formed and an area surrounding the gate electrode 22. Furthermore, in a part corresponding to an area other than where the drain electrode 23, and the area where the source electrode 21 is formed and areas surrounding the source electrode 21, a fourth electrode 31 is formed via an insulating film 32 which acts as a back side insulating film. Between the drain electrode 23 and the fourth electrode 31, insulation properties are maintained by the insulating film 32.

In the semiconductor device according to the present embodiment, a potential, which is substantially the same as the potential applied to the source electrode 21 or the gate electrode 22, is applied to the fourth electrode 31. Accordingly, when a potential that causes an on state is applied to the gate electrode 22, a current flows through the p-GaN layer 13 near the gate electrode 22 via the gate insulating film 15, as indicated by a dashed-line arrow C. However, a leakage current hardly flows in the p-GaN layer 13 in areas outside the above area.

When the same potential as that of the source electrode 21 is applied to the fourth electrode 31, and a potential that causes an on state is applied to the gate electrode 22, a current flows from the source electrode 21 to the drain electrode 23 in the p-GaN layer 13 near the gate electrode 22 via the gate insulating film 15. However, the fourth electrode 31 and the source electrode 21 have the same potential, and the insulating film 32 is formed, and therefore a current does not flow from the source electrode 21 to the fourth electrode 31.

Therefore, when a potential, which turns off the current flowing between the source electrode 21 and the drain electrode 23, is applied to the gate electrode 22, in this case also, a current hardly flows between the source electrode 21 and the drain electrode 23. That is to say, in the semiconductor device according to the present embodiment, in the on state, as indicated by a dashed-line arrow C, a current flows in an area of the p-GaN layer 13 via the gate insulating film 15 near the gate electrode 22, but a current does not flow in areas other than this area. Therefore, the leakage current is significantly decreased in the off state, and therefore device properties are improved.

Furthermore, the same applies to a case where the potential applied to the fourth electrode 31 is substantially the same as the potential applied to the gate electrode 22. In this case also, as indicated by the dashed-line arrow C, it is possible to make a current flow only to the p-GaN layer 13 near the gate electrode 22. Accordingly, it is possible to decrease the leakage current. If the potential applied to the fourth electrode 31 is less than or equal to the potential applied to the drain electrode 23 and greater than or equal to the potential applied to the source electrode 21 or the gate electrode 22, the same effects are achieved.

Manufacturing Method of Semiconductor Device

Next, a description is given of a manufacturing method of a semiconductor device according to the present embodiment, with reference to FIGS. 3A through 5B.

Figure 3A:
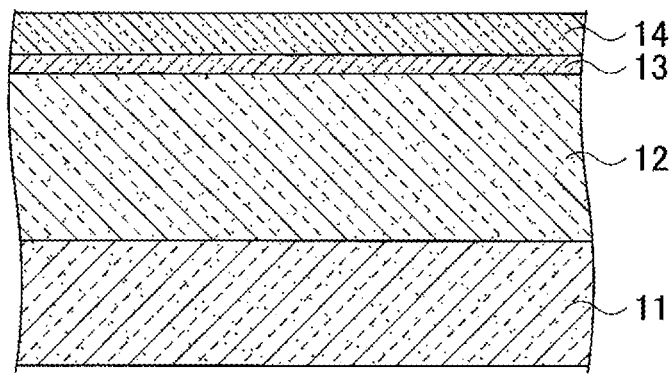
FIGS. 3A through 3C are manufacturing procedure diagrams of a semiconductor device according to a first embodiment (1)

First, as illustrated in FIG. 3A, on the substrate 11 made of $n^+$-SiC, by a MOVPE (Metal-Organic Vapor Phase Epitaxy) method, a buffer layer (not illustrated) is formed. On this buffer layer, the n-GaN layer 12, the p-GaN layer 13, and the n-GaN layer 14 are laminated.

The n-GaN layer 12 is formed to have a thickness of 1 μm through 10 μm, and $1 \times 10^{17}$ cm$^{-3}$ through $1 \times 10^{20}$ cm$^{-3}$ of Si is doped as an impurity element. The p-GaN layer 13 is formed to have a thickness of 10 nm through 1 μm, and approximately $1 \times 10^{19}$ cm$^{-3}$ of Mg is doped as an impurity element. The n-GaN layer 14 is formed to have a thickness of 10 nm through 1 μm, and $1 \times 10^{17}$ cm$^{-3}$ through $1 \times 10^{20}$ cm$^{-3}$ of Si is doped as an impurity element.

Figure 3B:
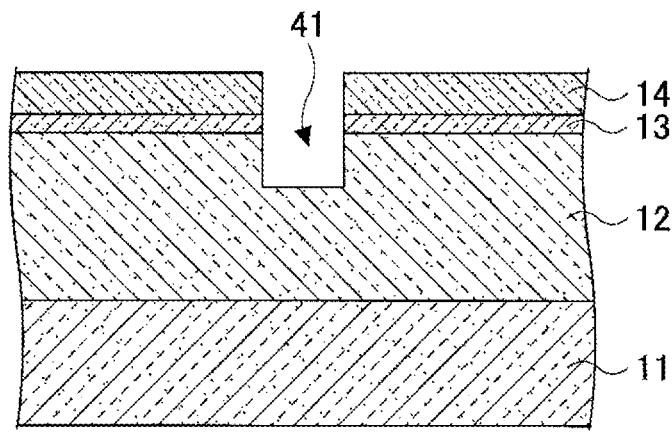

Next, as illustrated in FIG. 3B, an opening part 41 is formed in an area where the gate electrode 22 is formed as described below. Specifically, photoresist is applied on the n-GaN layer 14, and exposing and developing is performed with an exposing device, to form a resist pattern having an opening in the area where the opening part 41 is to be formed. Subsequently, dry etching such as RIE (Reactive Ion Etching) is performed with the use of gas including chlorine, to remove part of the n-GaN layer 14, the p-GaN layer 13, and the n-GaN layer 12, and form the opening part 41.

Figure 3C:
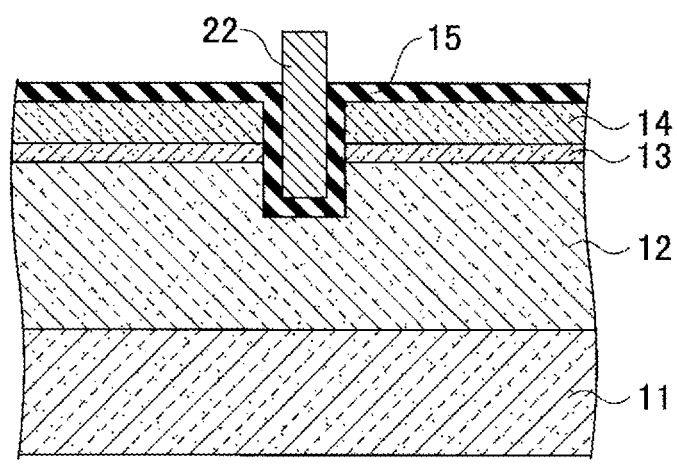

Next, as illustrated in FIG. 3C, the gate insulating film 15 is formed inside the opening part 41 and on the surface of the n-GaN layer 14, and the gate electrode 22 is formed inside the opening part 41 via the gate insulating film 15. Specifically, by plasma CVD (Chemical Vapor Deposition), the gate insulating film 15 made of SiN is formed to have a thickness of 1 nm through 1 μm, inside the opening part 41 and on the surface of the n-GaN layer 14. Subsequently, photoresist is applied on the surface of the gate insulating film 15, and exposing and developing is performed with an exposing device, to form a resist pattern having an opening in the area where the gate electrode 22 is to be formed. Furthermore, subsequently, a metal film made of Ni is formed by vacuum vapor deposition, and by dipping this in an organic solvent, the metal film formed on the resist pattern is removed together with the resist pattern by being lifted off. Accordingly, the gate electrode 22 is formed in the opening part 41 via the gate insulating film 15.

Figure 4A:
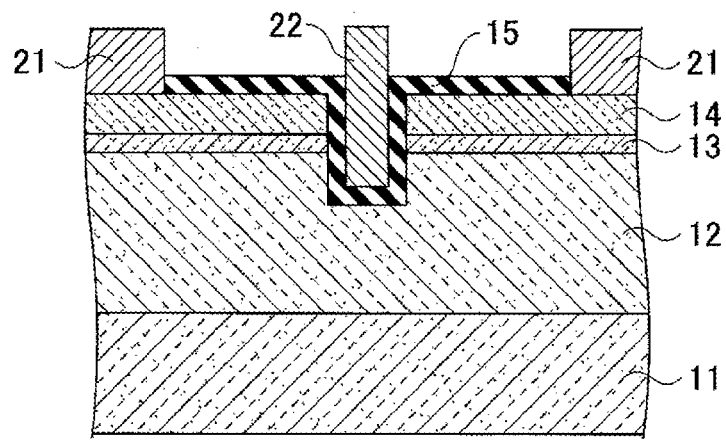
FIGS. 4A through 4C are manufacturing procedure diagrams of a semiconductor device according to the first embodiment (2)

Next, as illustrated in FIG. 4A, the source electrode 21 is formed. Specifically, photoresist is applied on the surface of the gate insulating film 15, and exposing and developing is performed with an exposing device, to form a resist pattern having an opening in the area where the source electrode 21 is to be formed. Subsequently, dry etching such as RIE is performed by using gas including fluorine, to remove the gate insulating film 15 so that the surface of the n-GaN layer 14 is exposed. Furthermore, subsequently, a metal film made of Ti/Au is formed by vacuum vapor deposition, and by dipping this in an organic solvent, the metal film formed on the resist pattern is removed together with the resist pattern by being lifted off. Accordingly, the source electrode 21 is formed on the n-GaN layer 14, and subsequently, ohmic contact is realized by performing a heat treatment in a nitrogen atmosphere.

Figure 4B:
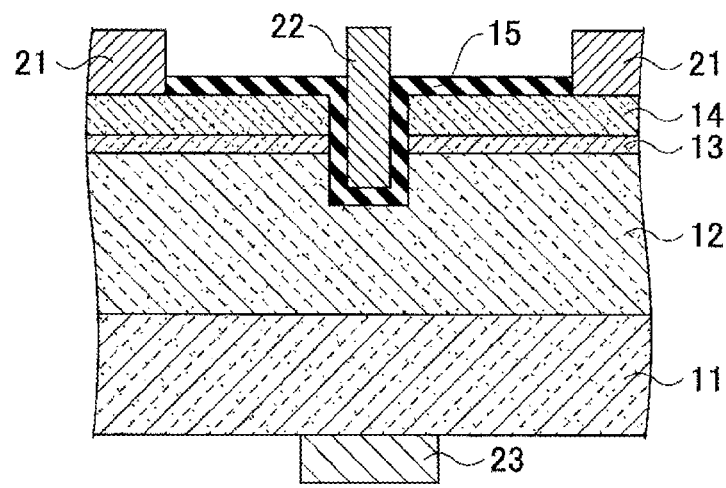

Next, as illustrated in FIG. 4B, on the back side of the substrate 11, the drain electrode 23 is formed at a part corresponding to the area where the gate electrode 22 is formed. Specifically, photoresist is applied on the back side of the substrate 11, and exposing and developing is performed with an exposing device, to form a resist pattern having an opening at the part where the drain electrode 23 is to be formed. Subsequently, a metal laminated film including Au is formed by vacuum vapor deposition, and by dipping this in an organic solvent, the metal laminated film formed on the resist pattern is removed together with the resist pattern by being lifted off. Accordingly, on the back side of the substrate 11, the drain electrode 23 is formed at a part corresponding to the area where the gate electrode 22 is formed. At this time, the drain electrode 23 is not formed at the part corresponding to the area where the source electrode 21 is formed.

Figure 4C:
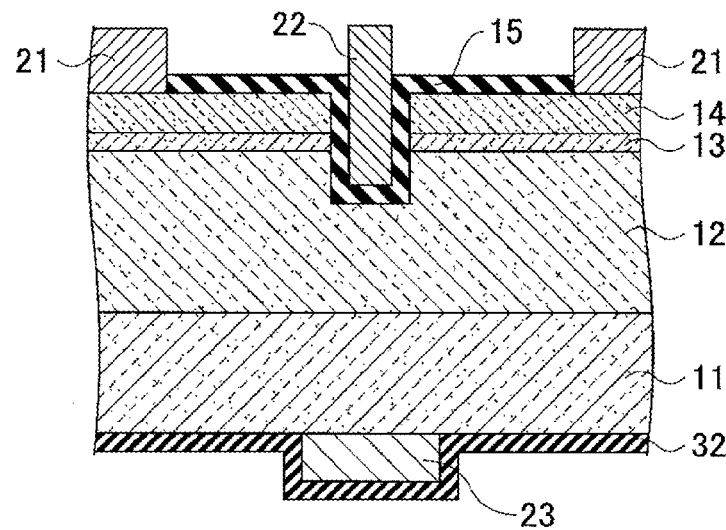

Next, as illustrated in FIG. 4C, the insulating film 32 is formed on the back side of the substrate 11 and on the drain electrode 23. Specifically, on the back side of the substrate 11 and on the drain electrode 23, the insulating film 32 made of SiN is formed to have a thickness of 10 nm through 10 μm by plasma CVD.

Figure 5A:
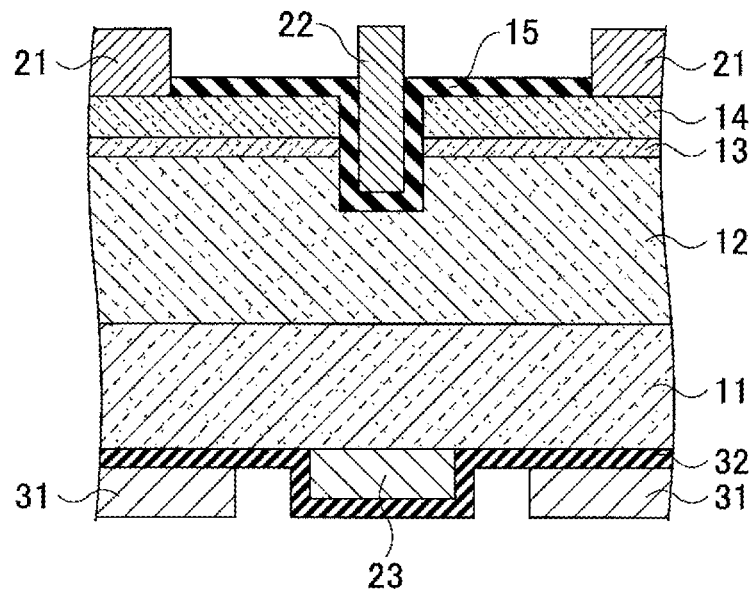
FIGS. 5A and 5B are manufacturing procedure diagrams of a semiconductor device according to the first embodiment (3)

Next, as illustrated in FIG. 5A, the fourth electrode 31 is formed in an area on the insulating film 32 where the drain electrode 23 is not formed. Specifically, photoresist is applied on the surface of the insulating film 32, and exposing and developing is performed with an exposing device, to form a resist pattern having an opening in the area where the fourth electrode 31 is to be formed. Subsequently, a metal laminated film made of Au is formed by vacuum vapor deposition, and by dipping this in an organic solvent, the metal laminated film formed on the resist pattern is removed together with the resist pattern by being lifted off. Accordingly, the fourth electrode 31 is formed on the insulating film 32, at a part corresponding to the area where the drain electrode 23 is not formed and the area where the source electrode 21 is formed.

Figure 5B:
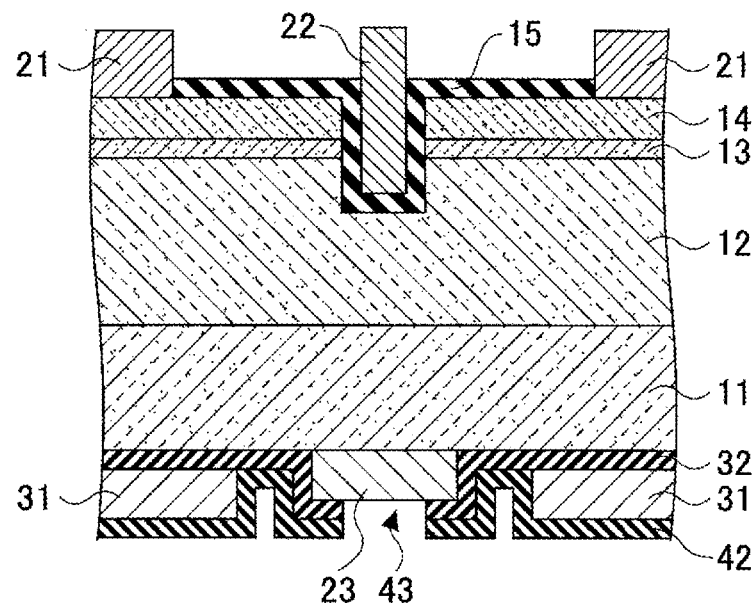

Next, as illustrated in FIG. 5B, the insulating film 42 is formed in an area including the fourth electrode 31, and then by removing part of the insulating films 32 and 42 in the area where the drain electrode 23 is formed, an opening part 43 is formed. Specifically, in an area including the fourth electrode 31, the insulating film 42 made of SiN is formed by plasma CVD. Subsequently, photoresist is applied on the insulating film 42, and exposing and developing is performed with an exposing device, to form a resist pattern having an opening in the area where the opening part 43 is to be formed. Furthermore, subsequently, dry etching such as RIE is performed by using gas including fluorine to remove part of the insulating films 32 and 42, so that the surface of the drain electrode 23 is exposed.

As described above, the semiconductor device according to the present embodiment is manufactured. The semiconductor device according to the present embodiment has a structure in which the source electrode 21 and the fourth electrode 31 are electrically connected by a via hole (not illustrated) provided in the substrate 11. However, as another structure of the semiconductor device according to the present embodiment, the gate electrode 22 may be electrically connected to the fourth electrode 31 by a via hole (not illustrated) provided in the substrate 11.

Second Embodiment

Next, a description is given of a manufacturing method of a semiconductor device according to a second embodiment, with reference to FIGS. 6A through 8B.

Figure 6A:
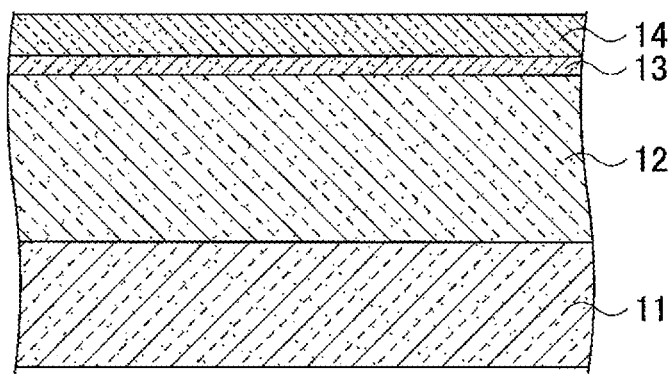
FIGS. 6A through 6C are manufacturing procedure diagrams of a semiconductor device according to a second embodiment (1)

First, as illustrated in FIG. 6A, on the substrate 11 made of $n^+$-SiC, by a MOVPE (Metal-Organic Vapor Phase Epitaxy) method, a buffer layer (not illustrated) is formed. On this buffer layer, the n-GaN layer 12, the p-GaN layer 13, and the n-GaN layer 14 are laminated.

Figure 6B:
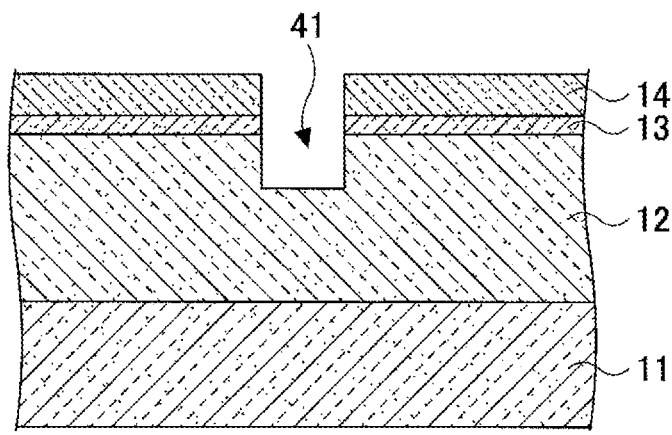

Next, as illustrated in FIG. 6B, an opening part 41 is formed in an area where the gate electrode 22 is formed as described below.

Figure 6C:
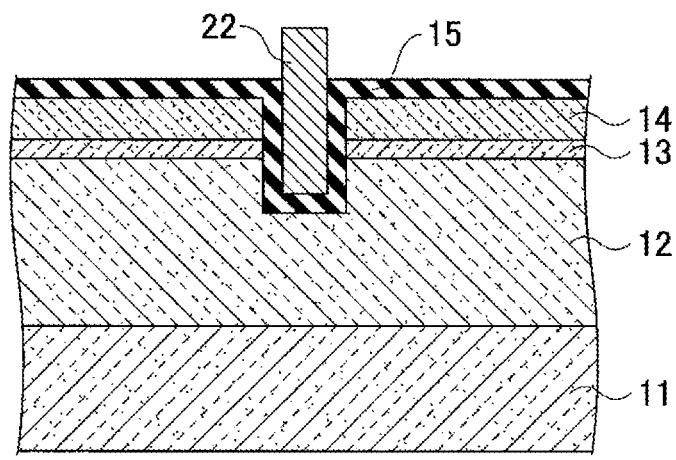

Next, as illustrated in FIG. 6C, the gate insulating film 15 is formed inside the opening part 41 and on the surface of the n-GaN layer 14, and the gate electrode 22 is formed inside the opening part 41 via the gate insulating film 15.

Figure 7A:
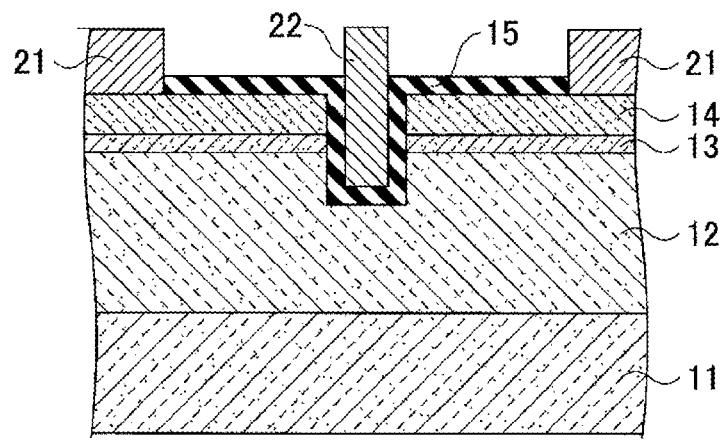
FIGS. 7A through 7C are manufacturing procedure diagrams of a semiconductor device according to the second embodiment (2)

Next, as illustrated in FIG. 7A, the source electrode 21 is formed.

Figure 7B:
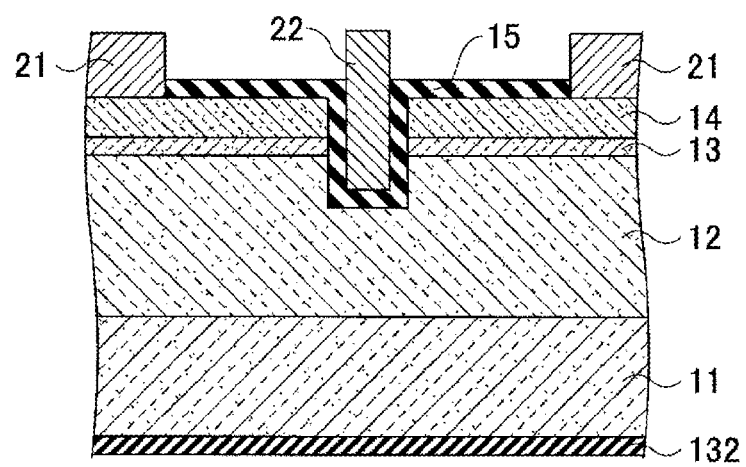

Next, as illustrated in FIG. 7B, on the back side of the substrate 11, an insulating film 132 to act as a back side insulating film is formed. Specifically, the insulating film 132 made of SiN formed to have a thickness of 10 nm through 10 μm is formed on the back side of the substrate 11 by plasma CVD.

Figure 7C:
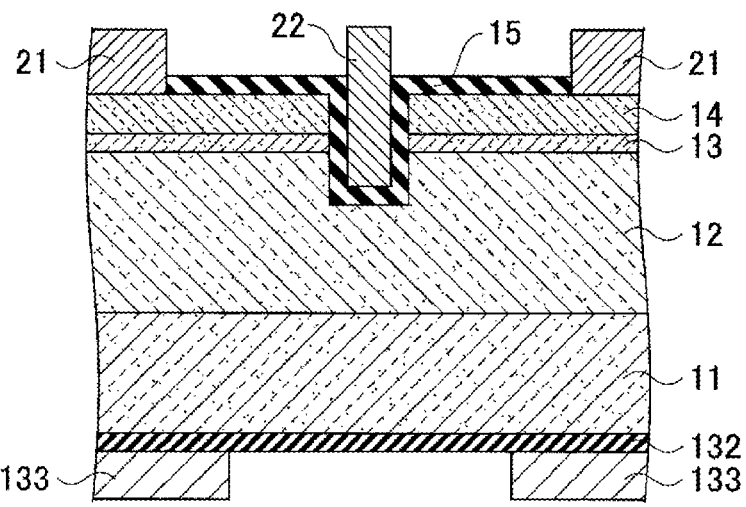

Next, as illustrated in FIG. 7C, a fourth electrode 133 is formed on the insulating film 132 in areas other than the part corresponding to the area where the gate electrode 22 is formed. Specifically, photoresist is applied on the insulating film 132, and exposing and developing is performed with an exposing device, to form a resist pattern having an opening at the part where the fourth electrode 133 is to be formed. Subsequently, a metal laminated film including Au is formed by vacuum vapor deposition, and by dipping this in an organic solvent, the metal laminated film formed on the resist pattern is removed together with the resist pattern by being lifted off. Accordingly, the fourth electrode 133 is formed on the insulating film 132 in areas other than the part corresponding to the area where the gate electrode 22 is formed, and at a part corresponding to the area where the source electrode 21 is formed.

Figure 8A:
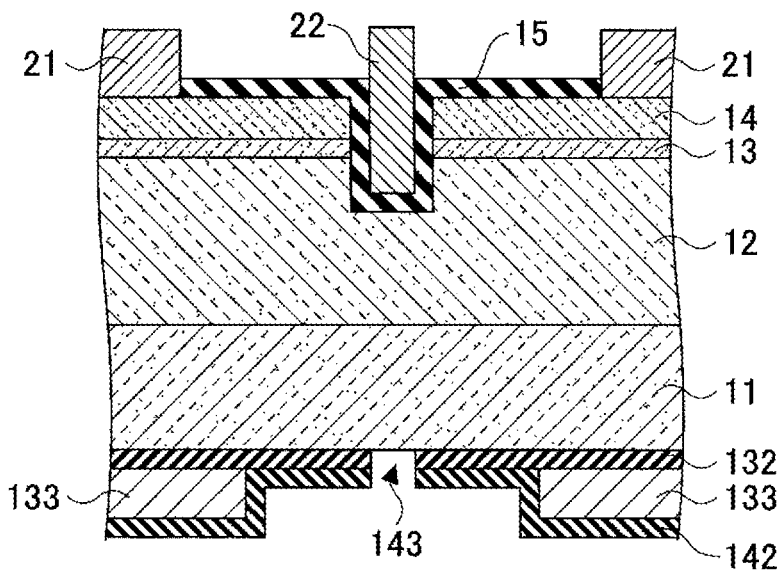
FIGS. 8A and 8B are manufacturing procedure diagrams of a semiconductor device according to the second embodiment (3)

Next, as illustrated in FIG. 8A, an insulating film 142 is formed on the fourth electrode 133 and the insulating film 132, and furthermore, the insulating film 132 and the insulating film 142 are removed at parts corresponding to the area where the gate electrode 22 is formed, to form an opening part 143. Specifically, the insulating film 142 made of SiN is formed on the fourth electrode 133 and the insulating film 132 by plasma CVD. Subsequently, photoresist is applied on the surface of the insulating film 142, and exposing and developing is performed with an exposing device, to form a resist pattern having an opening in the area where the opening part 143 is to be formed. Furthermore, subsequently, dry etching such as RIE is performed by using gas including fluorine, to remove the insulating film 132 and the insulating film 142 in the area where the resist pattern is not formed, so that part of the back side of the substrate 11 is exposed and the opening part 143 is formed.

Figure 8B:
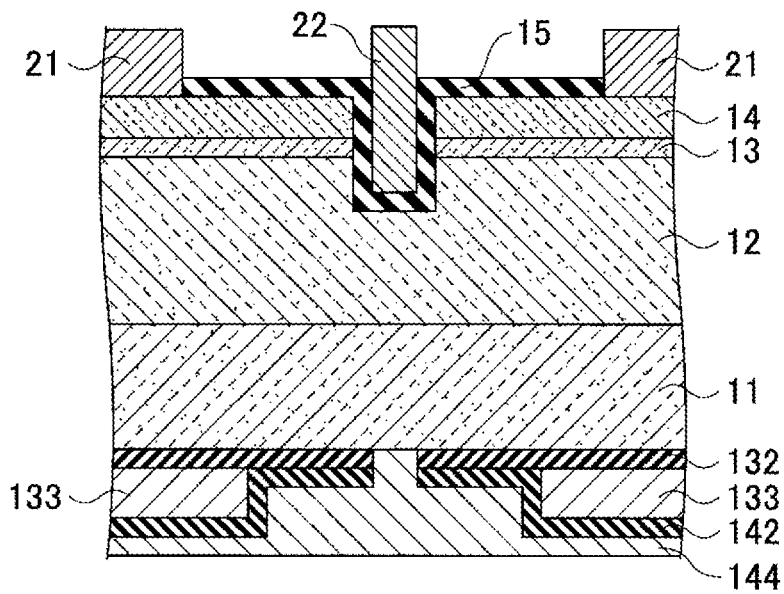

Next, as illustrated in FIG. 8B, a metal laminated film including Au is formed on the insulating film 142 and the exposed back side of the substrate 11, to form a drain electrode 144. This drain electrode 144 is connected with the substrate 11 whose back side is exposed at the opening part 143.

As described above, the semiconductor device according to the present embodiment is manufactured. The semiconductor device according to the present embodiment has a structure in which the source electrode 21 and the fourth electrode 133 are electrically connected by a via hole (not illustrated) provided in the substrate 11. However, as another structure of the semiconductor device according to the present embodiment, the gate electrode 22 may be electrically connected to the fourth electrode 133 by a via hole (not illustrated) provided in the substrate 11.

Contents other than the above are the same as the first embodiment.

Third Embodiment

Next, a description is given of a manufacturing method of a semiconductor device according to a third embodiment, with reference to FIGS. 9A through 11C.

Figure 9A:
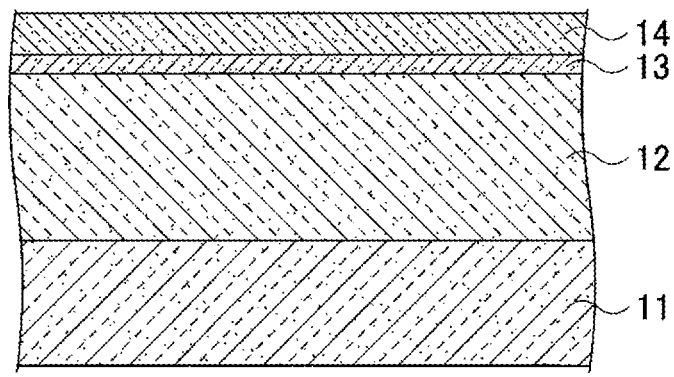
FIGS. 9A through 9C are manufacturing procedure diagrams of a semiconductor device according to a third embodiment (1)

First, as illustrated in FIG. 9A, on the substrate 11 made of n$^+$-SiC, by a MOVPE (Metal-Organic Vapor Phase Epitaxy) method, a buffer layer (not illustrated) is formed. On this buffer layer, the n-GaN layer 12, the p-GaN layer 13, and the n-GaN layer 14 are laminated.

Figure 9B:
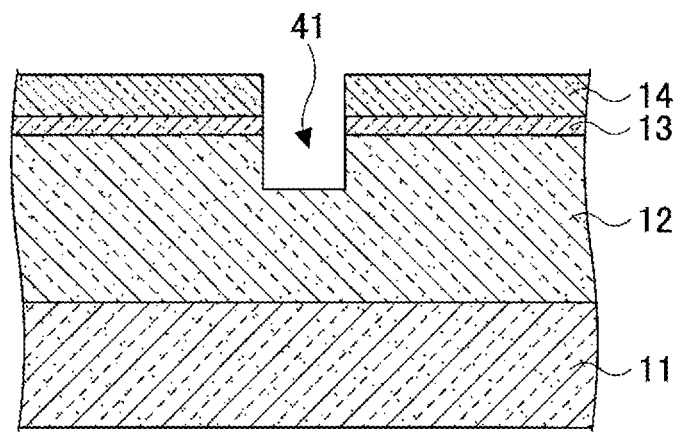

Next, as illustrated in FIG. 9B, an opening part 41 is formed in an area where the gate electrode 22 is formed as described below.

Figure 9C:
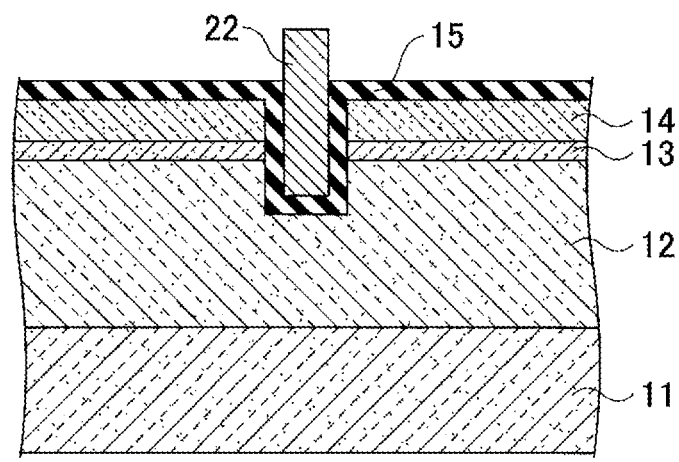

Next, as illustrated in FIG. 9C, the gate insulating film 15 is formed inside the opening part 41 and on the surface of the n-GaN layer 14, and the gate electrode 22 is formed inside the opening part 41 via the gate insulating film 15.

Figure 10A:
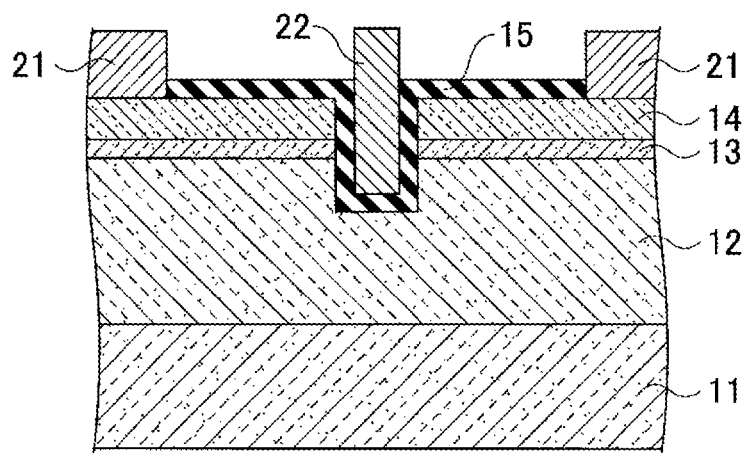
FIGS. 10A through 10C are manufacturing procedure diagrams of a semiconductor device according to the third embodiment (2)

Next, as illustrated in FIG. 10A, the source electrode 21 is formed.

Figure 10B:
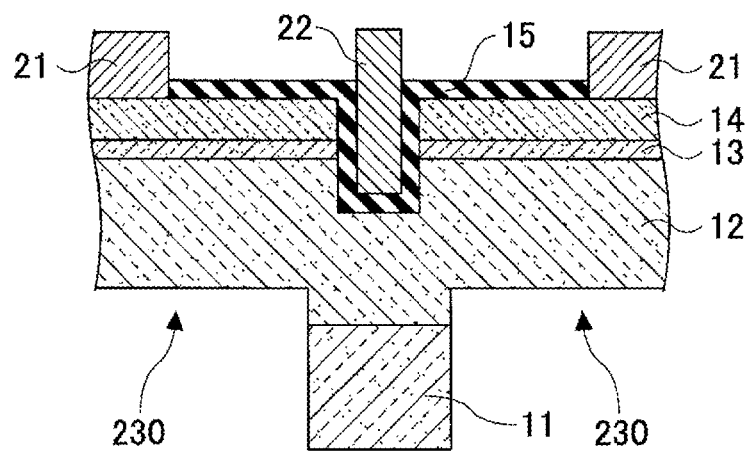

Next, as illustrated in FIG. 10B, on the back side of the substrate 11, part of the area excluding the part corresponding to the area where the gate electrode 22 is formed is removed by dry etching or ion milling, so that the n-GaN layer 12 is exposed and a back side removal area 230 is formed. Specifically, photoresist is applied on the back side of the substrate 11, and exposing and developing is performed with an exposing device, to form a resist pattern having an opening in the area where the back side of the substrate 11 is to be removed. Subsequently, part of the substrate 11 and the n-GaN layer 12 in the area where the resist pattern is not formed is removed by dry etching, so that the n-GaN layer 12 is exposed and the back side removal area 230 is formed. The back side removal area 230 is formed on the back side of the substrate 11 at a part corresponding to an area where the source electrode 21 is formed.

Figure 10C:
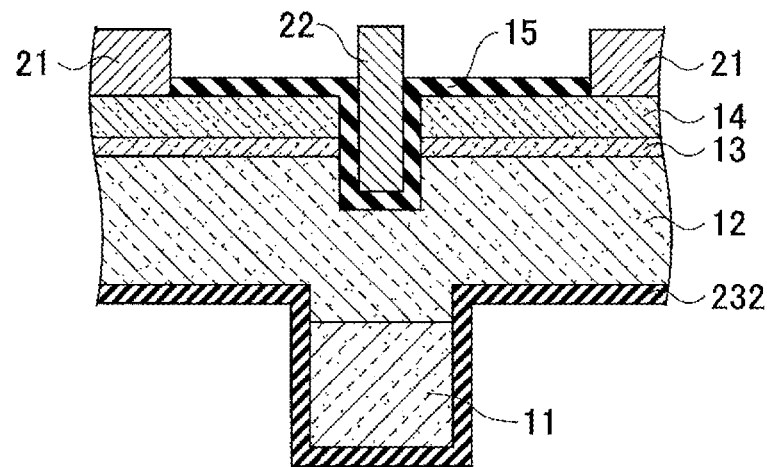

Next, as illustrated in FIG. 10C, on the back side of the substrate 11 and the back side removal area 230 where the n-GaN layer 12 is exposed, an insulating film 232 to act as a back side insulating film is formed. Specifically, the insulating film 232 made of SiN formed to have a thickness of 10 nm through 10 μm is formed by plasma CVD.

Figure 11A:
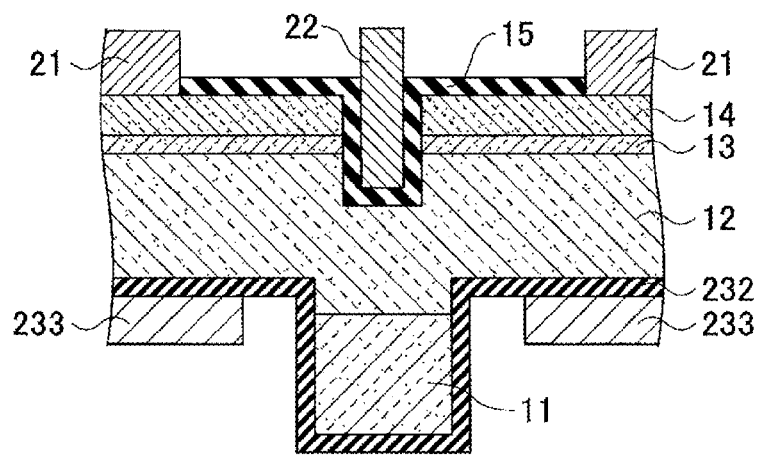
FIGS. 11A through 11C are manufacturing procedure diagrams of a semiconductor device according to the third embodiment (3)

Next, as illustrated in FIG. 11A, a fourth electrode 233 is formed on the insulating film 232 formed on the back side removal area 230. Specifically, photoresist is applied on the insulating film 232, and exposing and developing is performed with an exposing device, to form a resist pattern having an opening at the part where the fourth electrode 233 is to be formed. Subsequently, a metal laminated film including Au is formed by vacuum vapor deposition, and by dipping this in an organic solvent, the metal laminated film formed on the resist pattern is removed together with the resist pattern by being lifted off. Accordingly, the fourth electrode 233 is formed on the insulating film 232 formed on the back side removal area 230. The fourth electrode 233 formed as described above is formed at a part corresponding to the area where the source electrode 21 is formed.

Figure 11B:
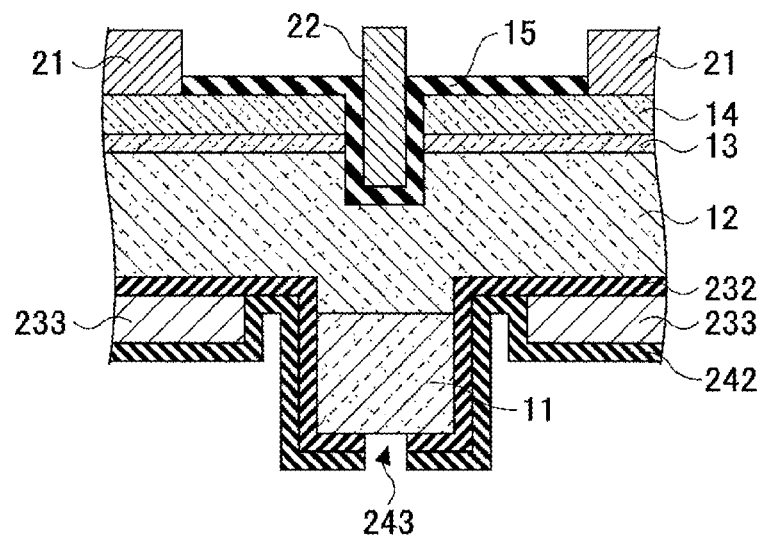

Next, as illustrated in FIG. 11B, an insulating film 242 is formed on the fourth electrode 233 and the insulating film 232, and furthermore, the insulating film 232 and the insulating film 242 are removed at a part corresponding to the area where the gate electrode 22 is formed, to form an opening part 243. Specifically, the insulating film 242 made of SiN is formed on the fourth electrode 233 and the insulating film 232 by plasma CVD. Subsequently, photoresist is applied on the insulating film 242, and exposing and developing is performed with an exposing device, to form a resist pattern having an opening in the area where the opening part 243 is to be formed. Furthermore, subsequently, dry etching such as RIE is performed by using gas including fluorine, to remove the insulating film 232 and the insulating film 242 in the area where the resist pattern is not formed, so that part of the back side of the substrate 11 is exposed and the opening part 243 is formed.

Figure 11C:
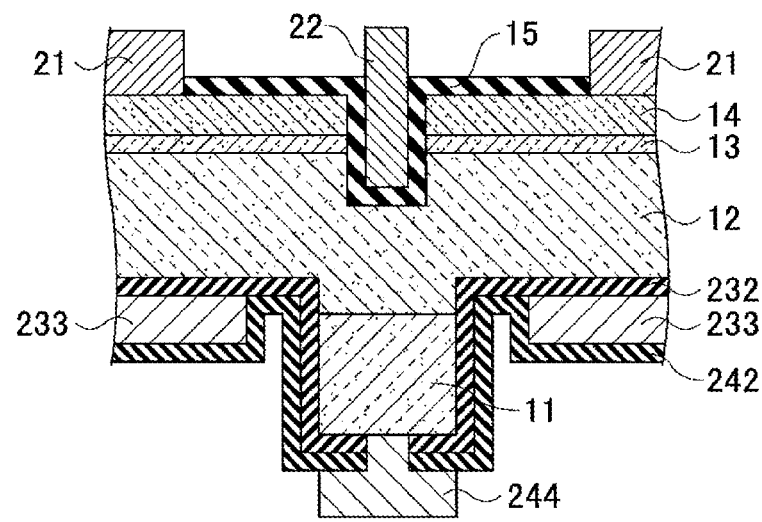

Next, as illustrated in FIG. 11C, a drain electrode 244 to be connected to the opening part 243 where the back side of the substrate 11 is exposed, is formed. Specifically, photoresist is applied on the surface of the insulating film 242, and exposing and developing is performed with an exposing device, to form a resist pattern having an opening in the area where the drain electrode 244 is to be formed. Subsequently, a metal laminated film including Au is formed by vacuum vapor deposition, and by dipping this in an organic solvent, the metal laminated film formed on the resist pattern is removed together with the resist pattern by being lifted off. Accordingly, the drain electrode 244 is formed, which is connected to the opening part 243 where the back side of the substrate 11 is exposed.

As described above, the semiconductor device according to the present embodiment is manufactured. The semiconductor device according to the present embodiment has a structure in which the source electrode 21 and the fourth electrode 233 are electrically connected by a via hole (not illustrated) provided in the substrate 11. However, as another structure of the semiconductor device according to the present embodiment, the gate electrode 22 may be electrically connected to the fourth electrode 233 by a via hole (not illustrated) provided in the substrate 11.

Contents other than the above are the same as the first embodiment.

Fourth Embodiment

Next, a description is given of a manufacturing method of a semiconductor device according to a fourth embodiment, with reference to FIGS. 12A through 14.

Figure 12A:
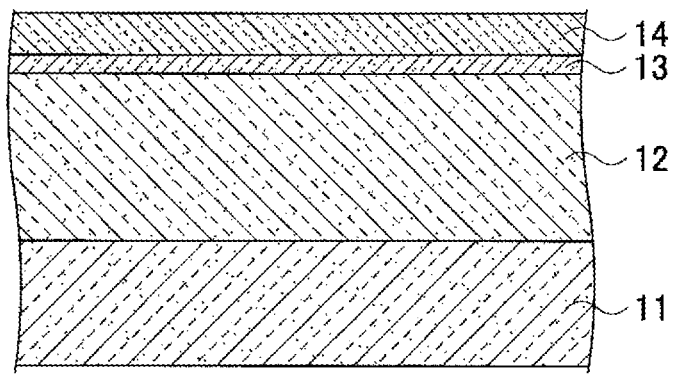
FIGS. 12A through 12C are manufacturing procedure diagrams of a semiconductor device according to a fourth embodiment (1)

First, as illustrated in FIG. 12A, on the substrate 11 made of n+-SiC, by a MOVPE (Metal-Organic Vapor Phase Epitaxy) method, a buffer layer (not illustrated) is formed. On this buffer layer, the n-GaN layer 12, the p-GaN layer 13, and the n-GaN layer 14 are laminated.

Figure 12B:
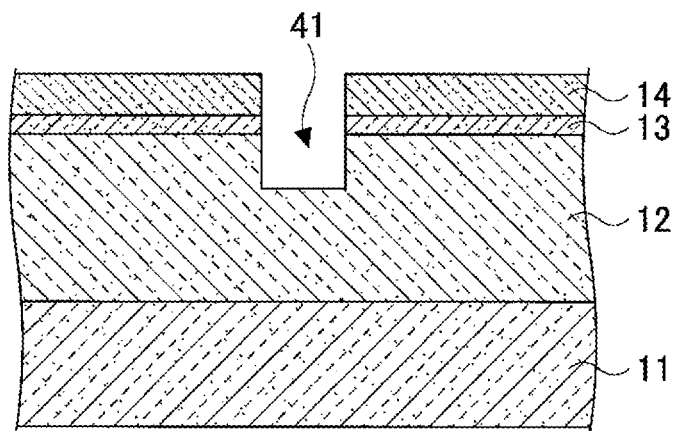

Next, as illustrated in FIG. 12B, an opening part 41 is formed in an area where the gate electrode 22 is formed as described below.

Figure 12C:
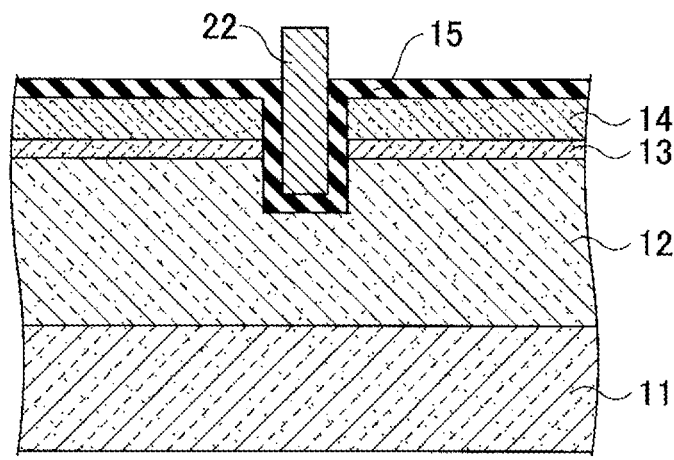

Next, as illustrated in FIG. 12C, the gate insulating film 15 is formed inside the opening part 41 and on the surface of the n-GaN layer 14, and the gate electrode 22 is formed inside the opening part 41 via the gate insulating film 15.

Figure 13A:
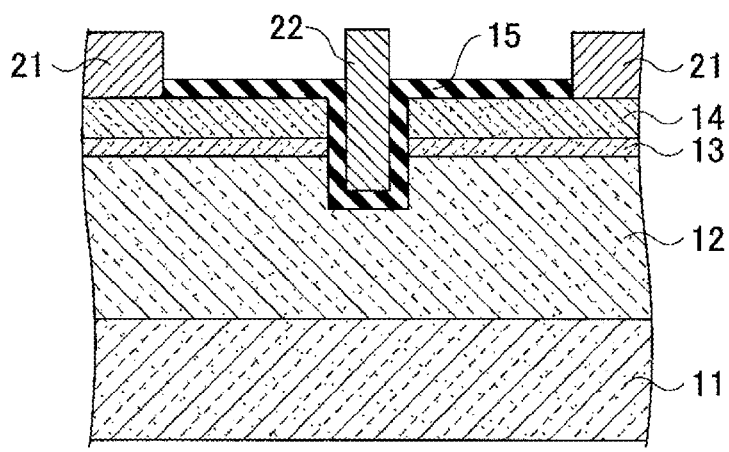
FIGS. 13A through 13C are manufacturing procedure diagrams of a semiconductor device according to the fourth embodiment (2)

Next, as illustrated in FIG. 13A, the source electrode 21 is formed. Specifically, photoresist is applied on the surface of the gate insulating film 15, and exposing and developing is performed with an exposing device, to form a resist pattern having an opening in the area where the source electrode 21 is to be formed.

Figure 13B:
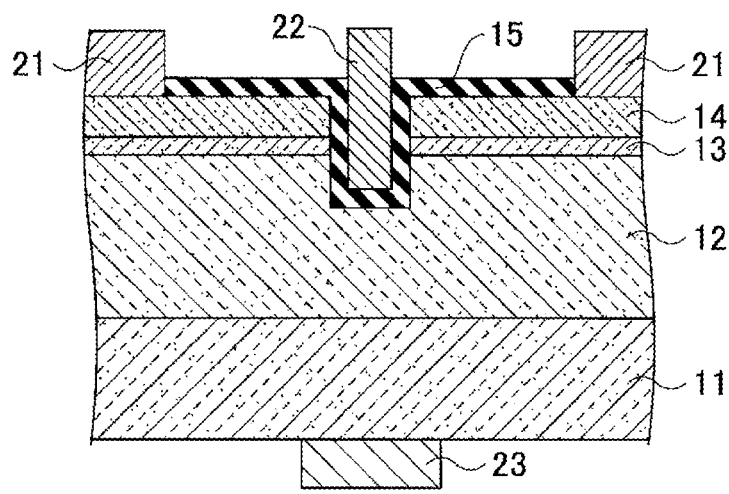

Next, as illustrated in FIG. 13B, on the back side of the substrate 11, the drain electrode 23 is formed at a part corresponding to the area where the gate electrode 22 is formed. The drain electrode 23 is not formed at a part corresponding to an area where the source electrode 21 is formed.

Figure 13C:
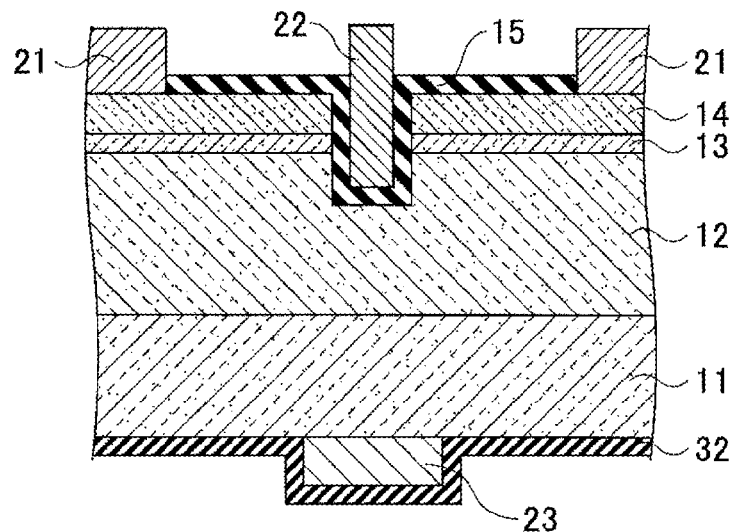

Next, as illustrated in FIG. 13C, the insulating film 32 is formed on the back side of the substrate 11 and on the drain electrode 23. Specifically, on the back side of the substrate 11 and on the drain electrode 23, the insulating film 32 made of SiN is formed to have a thickness of 10 nm through 10 µm by plasma CVD.

Figure 14:
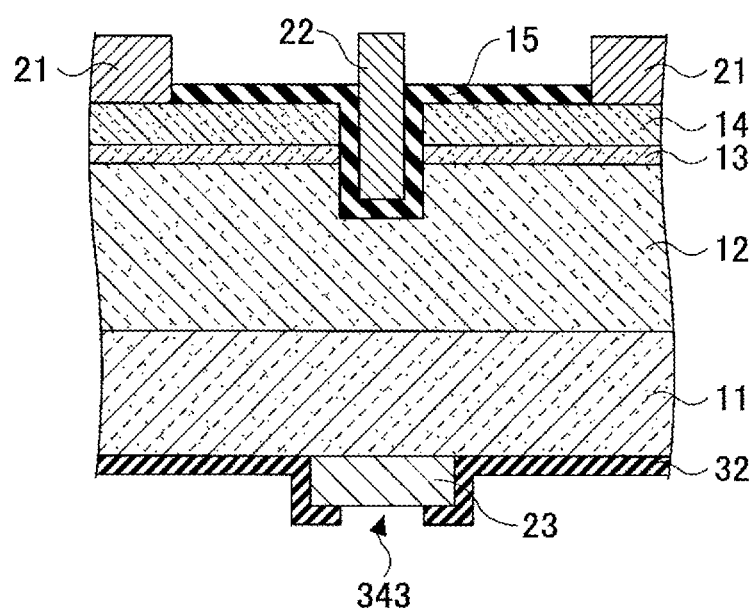
FIG. 14 is a manufacturing procedure diagram of a semiconductor device according to the fourth embodiment (3)

Next, as illustrated in FIG. 14, an opening part 343 is formed by removing part of the insulating film 32 in the area where the drain electrode 23 is formed. Specifically, photoresist is applied on the insulating film 32, and exposing and developing is performed with an exposing device, to form a resist pattern having an opening in the area where the opening part 343 is to be formed. Furthermore, subsequently, dry etching such as RIE is performed by using gas including fluorine to remove the insulating film 32 in an area where the resist pattern is not formed, so that part of the surface of the drain electrode 23 is exposed.

As described above, the semiconductor device according to the present embodiment is manufactured. In the semiconductor device according to the present embodiment, the drain electrode 23 is formed on the back side of the substrate 11 at a part corresponding to the area where the gate electrode 22 is formed, and is not formed at a part corresponding to the area where the source electrode 21 is formed. Therefore, it is possible to decrease the leakage current flowing between the source and the drain without providing a fourth electrode.

Contents other than the above are the same as the first embodiment.

Fifth Embodiment

Next, a description is given of a manufacturing method of a semiconductor device according to a fifth embodiment, with reference to FIGS. 15A through 17B.

Figure 15A:
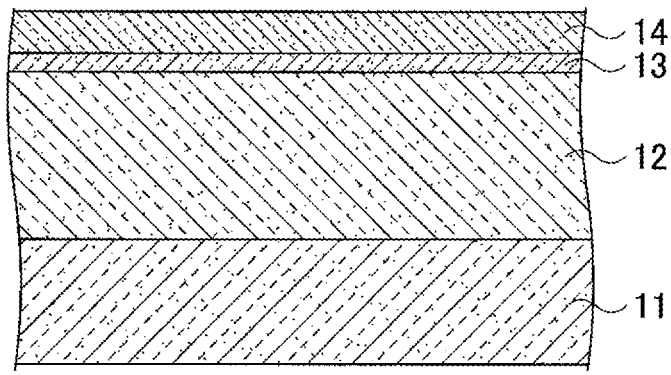
FIGS. 15A through 15C are manufacturing procedure diagrams of a semiconductor device according to a fifth embodiment (1)

First, as illustrated in FIG. 15A, on the substrate 11 made of n+-SiC, by a MOVPE (Metal-Organic Vapor Phase Epitaxy) method, a buffer layer (not illustrated) is formed. On this buffer layer, the n-GaN layer 12, the p-GaN layer 13, and the n-GaN layer 14 are laminated.

Figure 15B:
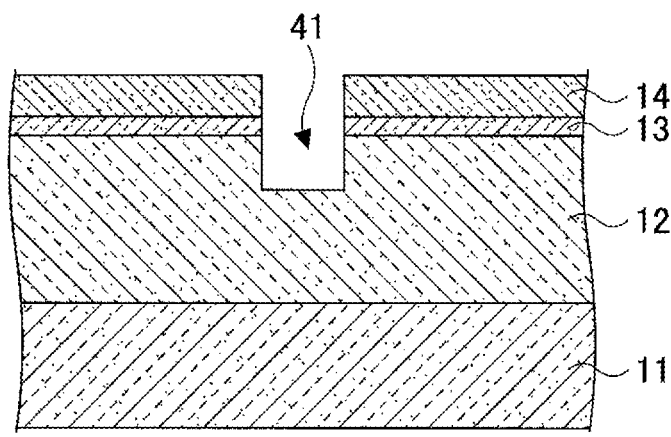

Next, as illustrated in FIG. 15B, an opening part 41 is formed in an area where the gate electrode 22 is formed as described below.

Figure 15C:
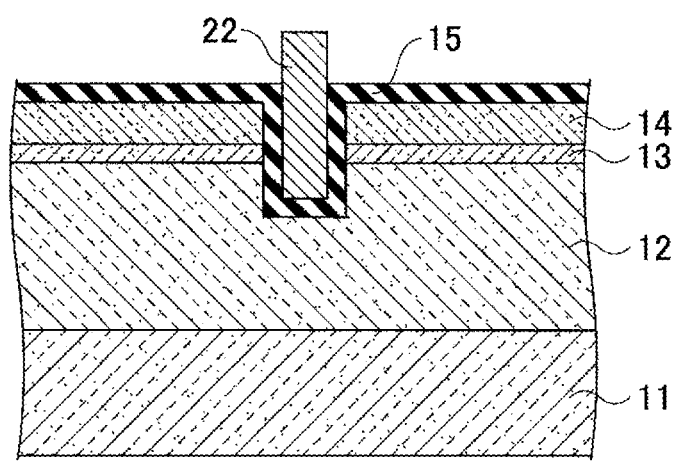

Next, as illustrated in FIG. 15C, the gate insulating film 15 is formed inside the opening part 41 and on the surface of the n-GaN layer 14, and the gate electrode 22 is formed inside the opening part 41 via the gate insulating film 15.

Figure 16A:
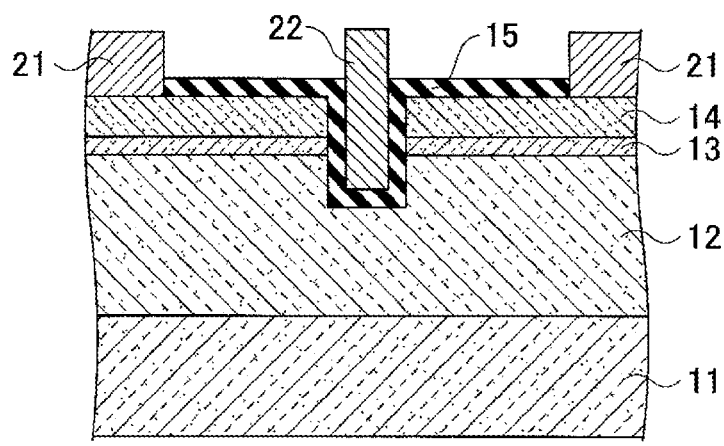
FIGS. 16A through 16C are manufacturing procedure diagrams of a semiconductor device according to the fifth embodiment (2)

Next, as illustrated in FIG. 16A, the source electrode 21 is formed.

Figure 16B:
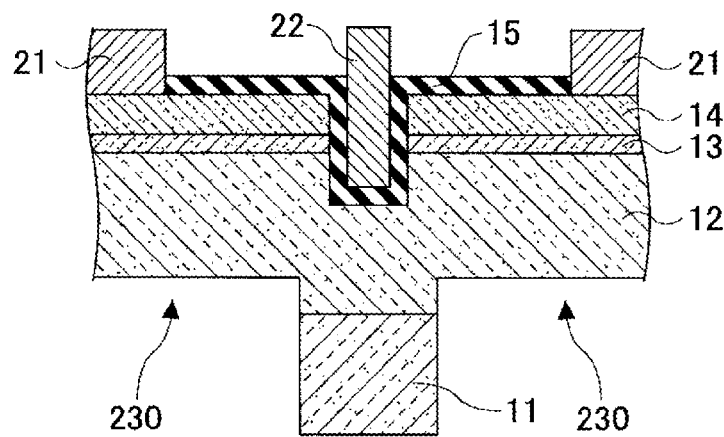

Next, as illustrated in FIG. 16B, on the back side of the substrate 11, part of the area excluding the part corresponding to the area where the gate electrode 22 is formed is removed by dry etching or ion milling, so that the n-GaN layer 12 is exposed and a back side removal area 230 is formed. Specifically, photoresist is applied on the back side of the substrate 11, and exposing and developing is performed with an exposing device, to form a resist pattern having an opening in the area where the back side of the substrate 11 is to be removed. Subsequently, part of the substrate 11 and the n-GaN layer 12 in the area where the resist pattern is not formed is removed by dry etching, so that the back side removal area 230 is formed. The back side removal area 230 is formed at a part corresponding to an area where the source electrode 21 is formed.

Figure 16C:
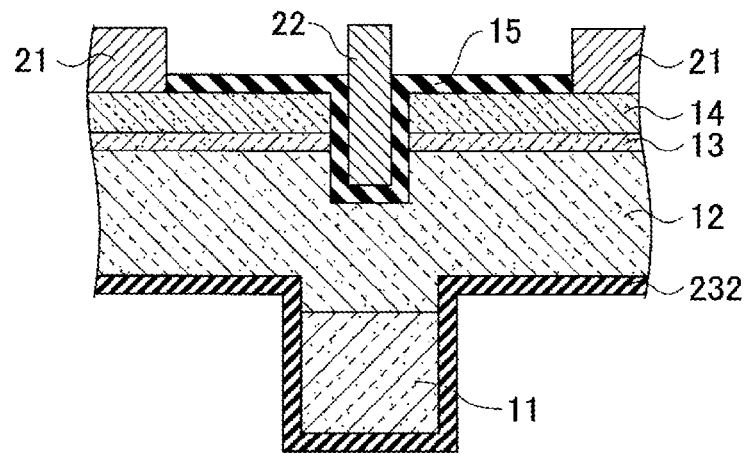

Next, as illustrated in FIG. 16C, on the back side of the substrate 11 and the back side removal area 230 where the n-GaN layer 12 is exposed, an insulating film 232 is formed. Specifically, the insulating film 232 made of SiN formed to have a thickness of 10 nm through 10 µm is formed by plasma CVD.

Figure 17A:
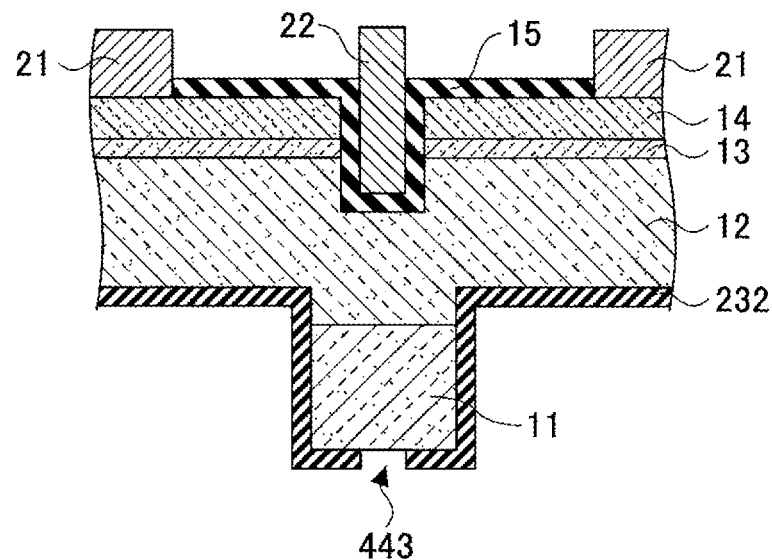
FIGS. 17A and 17B are manufacturing procedure diagrams of a semiconductor device according to the fifth embodiment (3).

Next, as illustrated in FIG. 17A, by removing the insulating film 232 at a part corresponding to the area where the gate electrode 22 is formed, an opening part 443 is formed. Specifically, photoresist is applied on the insulating film 232, and exposing and developing is performed with an exposing device, to form a resist pattern having an opening in the area where the opening part 443 is to be formed. Furthermore, subsequently, dry etching such as RIE is performed by using gas including fluorine to remove the insulating film 232 in the area where the resist pattern is not formed, so that the back side of the substrate 11 is exposed and the opening part 443 is formed.

Figure 17B:
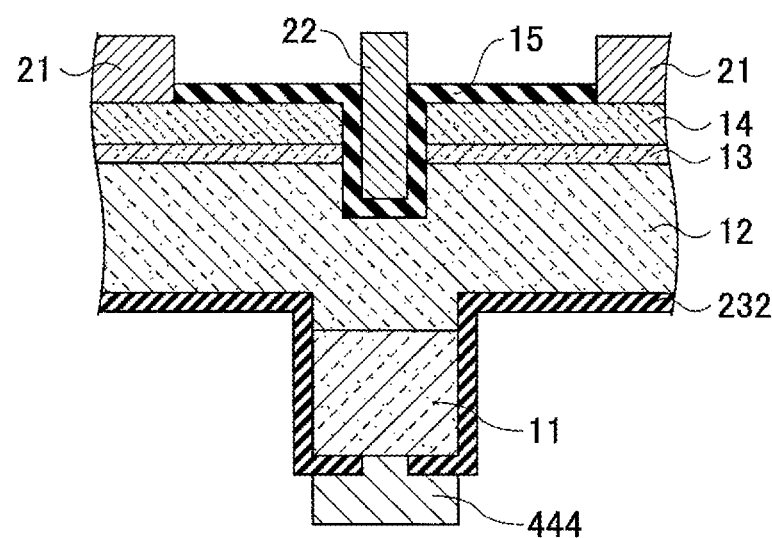

Next, as illustrated in FIG. 17B, a drain electrode 444 is formed, which is to be connected at the opening part 443 where the back side of the substrate 11 is exposed. Specifically, photoresist is applied on the surface of the insulating film 232, and exposing and developing is performed with an exposing device, to form a resist pattern having an opening in the area where the drain electrode 444 is to be formed. Subsequently, a metal laminated film including Au is formed by vacuum vapor deposition, and by dipping this in an organic solvent, the metal laminated film formed on the resist pattern is removed together with the resist pattern by being lifted off. Accordingly, the drain electrode 444 is formed. The drain electrode 444 is connected to the back side of the substrate 11, at the opening part 443 where the back side of the substrate 11 is exposed.

As described above, the semiconductor device according to the present embodiment is manufactured. In the semiconductor device according to the present embodiment, the drain electrode 444 is formed on the back side of the substrate 11 at a part corresponding to the area where the gate electrode 22 is formed, and is not formed at a part corresponding to the area where the source electrode 21 is formed. Therefore, it is possible to decrease the leakage current flowing between the source and the drain without providing a fourth electrode.

Contents other than the above are the same as the third embodiment.

According to an aspect of the embodiments, a semiconductor device and a manufacturing method of a semiconductor device are provided, in which the insulation breakdown voltage is high, the chip size is small, and the amount of leakage current is small.

The present invention is not limited to the specific embodiments described herein, and variations and modifications may be made without departing from the scope of the present invention.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A method of manufacturing a semiconductor device, the method comprising:
    forming, on one side of a semiconductor substrate having conductivity, a first semiconductor layer of a first conductivity type, a second semiconductor layer of a second conductivity type, and a third semiconductor layer of the first conductivity type;
    forming an opening part by removing part of the third semiconductor layer, the second semiconductor layer, and the first semiconductor layer;
    forming a gate insulating film inside the opening part;
    forming a gate electrode inside the opening part via the gate insulating film;
    forming a source electrode on the third semiconductor layer;
    forming a drain electrode including an exposed surface and connected to a part corresponding to the gate electrode on another side of the semiconductor substrate; and
    forming a fourth electrode on the another side of the semiconductor substrate at a part corresponding to the source electrode;
    wherein the gate electrode extends in a direction that perpendicularly intersects the exposed surface of the drain electrode,
    wherein the source electrode is formed on both sides of the gate electrode in a horizontal direction, so that the gate electrode is interposed therebetween,
    wherein the drain electrode has a contact surface in electrical, physical contact with the semiconductor substrate, and
    wherein the contact surface of the drain electrode is nonexistent directly below the source electrode in a thickness direction of the semiconductor substrate.

2. The method according to claim 1, further comprising:
    forming a back side insulating film on the another side of the semiconductor substrate before forming the fourth electrode; and
    forming the fourth electrode on the back side insulating film.

3. A method of manufacturing a semiconductor device, the method comprising:
    forming, on one side of a semiconductor substrate having conductivity, a first semiconductor layer of a first conductivity type, a second semiconductor layer of a second conductivity type, and a third semiconductor layer of the first conductivity type;
    forming an opening part by removing part of the third semiconductor layer, the second semiconductor layer, and the first semiconductor layer;
    forming a gate insulating film inside the opening part;
    forming a gate electrode inside the opening part via the gate insulating film;
    forming a source electrode on the third semiconductor layer;
    forming a back side removal area by removing, from another side of the semiconductor substrate, part of the semiconductor substrate and the first semiconductor layer at a part corresponding to the source electrode;
    forming a fourth electrode in the back side removal area; and
    forming a drain electrode including an exposed surface and connected to a part corresponding to the gate electrode on the another side of the semiconductor substrate;
    wherein the gate electrode extends in a direction that perpendicularly intersects the exposed surface of the drain electrode,
    wherein the source electrode is formed on both sides of the gate electrode in a horizontal direction, so that the gate electrode is interposed therebetween,
    wherein the drain electrode has a contact surface in electrical, physical contact with the semiconductor substrate, and
    wherein the contact surface of the drain electrode is nonexistent directly below the source electrode in a thickness direction of the semiconductor substrate.

4. The method according to claim 3, further comprising:
    forming a back side insulating film in the back side removal area where the first semiconductor layer is exposed, after forming the back side removal area and before forming the fourth electrode; and forming the fourth electrode on the back side insulating film.

5. A method of manufacturing a semiconductor device, the method comprising:
forming, on one side of a semiconductor substrate having conductivity, a first semiconductor layer of a first conductivity type, a second semiconductor layer of a second conductivity type, and a third semiconductor layer of the first conductivity type;
forming an opening part by removing part of the third semiconductor layer, the second semiconductor layer, and the first semiconductor layer;
forming a gate insulating film inside the opening part;
forming a gate electrode inside the opening part via the gate insulating film;
forming a source electrode on the third semiconductor layer; and
forming a drain electrode including an exposed surface and connected to a part corresponding to the gate electrode, and not connected to a part corresponding to the source electrode, on another side of the semiconductor substrate;
wherein the gate electrode extends in a direction that perpendicularly intersects the exposed surface of the drain electrode,
wherein the source electrode is formed on both sides of the gate electrode in a horizontal direction, so that the gate electrode is interposed therebetween,
wherein the drain electrode has a contact surface in electrical, physical contact with the semiconductor substrate, and
wherein the contact surface of the drain electrode is nonexistent directly below the source electrode in a thickness direction of the semiconductor substrate.

6. The method according to claim 5, further comprising:
forming a back side insulating film at a part corresponding to the source electrode on the another side of the semiconductor substrate.

7. A method of manufacturing a semiconductor device, the method comprising:
forming, on one side of a semiconductor substrate having conductivity, a first semiconductor layer of a first conductivity type, a second semiconductor layer of a second conductivity type, and a third semiconductor layer of the first conductivity type;
forming an opening part by removing part of the third semiconductor layer, the second semiconductor layer, and the first semiconductor layer;
forming a gate insulating film inside the opening part;
forming a gate electrode inside the opening part via the gate insulating film;
forming a source electrode on the third semiconductor layer;
forming a back side removal area by removing, from another side of the semiconductor substrate, part of the semiconductor substrate and the first semiconductor layer at a part corresponding to the source electrode; and
forming a drain electrode including an exposed surface and connected to a part corresponding to the gate electrode on the another side of the semiconductor substrate;
wherein the gate electrode extends in a direction that perpendicularly intersects the exposed surface of the drain electrode,
wherein the source electrode is formed on both sides of the gate electrode in a horizontal direction, so that the gate electrode is interposed therebetween,
wherein the drain electrode has a contact surface in electrical, physical contact with the semiconductor substrate, and
wherein the contact surface of the drain electrode is nonexistent directly below the source electrode in a thickness direction of the semiconductor substrate.

8. The method according to claim 7, further comprising:
forming a back side insulating film in the back side removal area where the first semiconductor layer is exposed, after forming the back side removal area.

* * * * *